United States Patent
Inamura et al.

(10) Patent No.: US 10,550,321 B2
(45) Date of Patent: Feb. 4, 2020

(54) PHOSPHOR AND USE THEREOF

(71) Applicant: Mitsui Mining & Smelting Co., Ltd., Tokyo (JP)

(72) Inventors: Masaaki Inamura, Ageo (JP); Haruka Shimizu, Shimonoseki (JP); Takayoshi Mori, Ageo (JP); Masanori Sato, Ageo (JP); Jun-ichi Itoh, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 10 days.

(21) Appl. No.: 15/129,188

(22) PCT Filed: Jan. 15, 2015

(86) PCT No.: PCT/JP2015/050916
§ 371 (c)(1),
(2) Date: Sep. 26, 2016

(87) PCT Pub. No.: WO2015/146231
PCT Pub. Date: Oct. 1, 2015

(65) Prior Publication Data
US 2017/0101579 A1 Apr. 13, 2017

(30) Foreign Application Priority Data

Mar. 27, 2014 (JP) ................. 2014-065862

(51) Int. Cl.
*C09K 11/02* (2006.01)
*H01L 31/055* (2014.01)
(Continued)

(52) U.S. Cl.
CPC ........ *C09K 11/025* (2013.01); *C09K 11/7718* (2013.01); *C09K 11/7721* (2013.01);
(Continued)

(58) Field of Classification Search
CPC .............. C09K 11/025; C09K 11/7731; C09K 11/7718; C09K 11/7721; C09K 11/7786;
(Continued)

(56) References Cited

U.S. PATENT DOCUMENTS 3,503,780 A * 3/1970 Shigeru ................... C01B 35/06
106/313
4,309,481 A * 1/1982 Wakatsuki .......... C09K 11/025
252/301.4 R
(Continued)

FOREIGN PATENT DOCUMENTS

| CN | 1510102 A | 7/2004 |
| CN | 103154192 A | 6/2013 |

(Continued)

OTHER PUBLICATIONS

JP 2012087162 english machine translation.*
(Continued)

*Primary Examiner* — Andrew J Golden
(74) *Attorney, Agent, or Firm* — The Webb Law Firm

(57) ABSTRACT

Proposed is a phosphor capable of effectively inhibiting the occurrence of adverse influence of a sulfur-based gas while improving water resistance of the phosphor and effectively inhibiting the corrosion of a metallic member. A phosphor is proposed, which includes particles or a layer provided on the surface of a sulfur-containing phosphor, which contains sulfur in a host material, and containing a crystalline metal borate containing an IIA-Group element, boron, and oxygen.

14 Claims, 5 Drawing Sheets

(51) Int. Cl.
*H01L 33/50* (2010.01)
*C09K 11/77* (2006.01)

(52) U.S. Cl.
CPC ...... *C09K 11/7731* (2013.01); *C09K 11/7786* (2013.01); *H01L 31/055* (2013.01); *H01L 33/502* (2013.01); *H01L 33/501* (2013.01); *Y02E 10/52* (2013.01)

(58) Field of Classification Search
CPC ... H01L 31/055; H01L 33/501; H01L 33/502; H01J 61/40; H01J 61/44; H01J 61/46; H01J 61/48
USPC .............. 136/243–265; 252/301.6 S, 301.4 S
See application file for complete search history.

(56) References Cited

U.S. PATENT DOCUMENTS

| | | | | |
|---|---|---|---|---|
| 4,384,237 | A | * | 5/1983 | Taubner ............ H01J 61/46 313/486 |
| 4,451,757 | A | * | 5/1984 | Lagos ............... H01J 61/46 313/489 |
| 4,897,249 | A | * | 1/1990 | Ross ................. C01B 35/126 423/279 |
| 5,417,886 | A | * | 5/1995 | Tateiwa ............ C09K 11/025 106/287.27 |
| 6,180,029 | B1 | * | 1/2001 | Hampden-Smith ................... C09K 11/025 252/301.4 R |
| 6,686,691 | B1 | | 2/2004 | Mueller et al. |
| 7,202,598 | B2 | | 4/2007 | Juestel et al. |
| 7,820,074 | B2 | | 10/2010 | Kim et al. |
| 7,832,312 | B2 | | 11/2010 | Yoon et al. |
| 8,012,792 | B2 | | 9/2011 | Yoon et al. |
| 8,262,936 | B2 | | 9/2012 | Kim et al. |
| 9,312,454 | B2 | | 4/2016 | Itoh et al. |
| 2004/0166320 | A1 | | 8/2004 | Kobusch |
| 2006/0162770 | A1 | * | 7/2006 | Matsui ............... H01G 9/2031 136/263 |
| 2008/0003160 | A1 | * | 1/2008 | Kim .................. C09K 11/025 423/305 |
| 2012/0306354 | A1 | | 12/2012 | Seibel, II et al. |
| 2013/0048214 | A1 | * | 2/2013 | Kalkowski ............ C09J 5/02 156/325 |
| 2013/0256715 | A1 | | 10/2013 | Itoh et al. |
| 2014/0191652 | A1 | * | 7/2014 | Hirrle ................ C09K 11/025 313/486 |

FOREIGN PATENT DOCUMENTS

| | | | |
|---|---|---|---|
| JP | 2002-60747 | A | 2/2002 |
| JP | 2002-080845 | A | 3/2002 |
| JP | 2002-173675 | A | 6/2002 |
| JP | 2002-223008 | A | 8/2002 |
| JP | 2003-041250 | A | 2/2003 |
| JP | 2003-064278 | A | 3/2003 |
| JP | 2004-250705 | A | 9/2004 |
| JP | 2005-082788 | A | 3/2005 |
| JP | 2006-028458 | A | 2/2006 |
| JP | 2007-56267 | A | 3/2007 |
| JP | 2007-214579 | A | 8/2007 |
| JP | 2008-7779 | A | 1/2008 |
| JP | 2009-013186 | A | 1/2009 |
| JP | 2012-087162 | A | 5/2012 |
| JP | 2012087162 | A * | 5/2012 |
| JP | 2015-063619 | A | 4/2015 |
| WO | 2007/080555 | A1 | 7/2007 |
| WO | 2013/017340 | A2 | 2/2012 |
| WO | 2012/077656 | A1 | 6/2012 |
| WO | 2012/166855 | A1 | 6/2012 |
| WO | WO-2013017340 | A2 * | 2/2013 ........... C09K 11/025 |
| WO | 2014/017334 | A1 | 1/2014 |
| WO | 2014/021353 | A1 | 2/2014 |
| WO | 2014/065292 | A1 | 5/2014 |

OTHER PUBLICATIONS

Babeela et al, Optical limiting behavior of β-BaB2O4 nanoparticles in pulsed and continuous wave regime, 2015, J. Phys. D: Appl. Phys. 48, 1-7. (Year: 2015).*

Qu et al, Synthesis of Optical-Quality Single-Crystal β-BaB2O4 Microwires and Nanowires, 2013, Adv. Funct. Mater., 23, 1232-1237. (Year: 2013).*

* cited by examiner

PHOSPHOR AND USE THEREOF

CROSS-REFERENCE TO RELATED APPLICATIONS

This application is the United States national phase of International Application No. PCT/JP2015/050916 filed Jan. 15, 2015, and claims priority to Japanese Patent Application No. 2014-065862 filed Mar. 27, 2014, the disclosures of which are hereby incorporated in their entirety by reference.

TECHNICAL FIELD

The present invention relates to a phosphor which contains sulfur in a host material and use thereof.

BACKGROUND ART

As a representative example of a red phosphor, for example, a sulfur-containing phosphor containing sulfur in a host material, such as (Ca, Sr)S:Eu, (Zn, Cd)(S, Se):Ag, or $Ba_2ZnS_3$:Mn, is known.

In addition, Patent Document 1 or Patent Document 2 discloses a sulfur-containing red phosphor containing calcium sulfide (CaS) as a host material, Eu as a luminescent center (activator), and Mn, Li, Cl, Ce, Gd or the like as a sensitizer (co-activator).

Further, as a green phosphor, a sulfide-based thiogallate phosphor represented by $(Ca, Sr, Ba)(Al, Ga, In)_2S_4$:Eu is known (Patent Document 3, Patent Document 4, and Patent Document 5), and as a blue phosphor, for example, a sulfur-containing phosphor, such as SrS:Ce, $(Sr, Ca)Ga_2S_4$:Ce, $BaAl_2S_4$:Eu, or $Ba_2SiS_4$:Ce, is known.

Furthermore, a core-shell type CdSe/ZnS or the like as a quantum dot phosphor in which luminescence wavelength can be adjusted by controlling the size of nanoparticles is also known (Patent Document 6).

Such a sulfur-containing phosphor containing sulfur in a host material is excited by an LED or the like, and can emit various colors of light depending on composition. Thus, the sulfur-containing phosphor has been developed as various phosphors.

However, there has been pointed out a problem in connection with this type of the sulfur-containing phosphor that hydrogen sulfide gas is generated by sulfur in the sulfur-containing phosphor, and this hydrogen sulfide gas causes, particularly in a case in which the sulfur-containing phosphor is used in a white LED element, inhibition of curing of a silicone resin that is mixed with the phosphor; corrosion of metal members inside the element, such as an Ag plating film provided so as to increase the reflectance of a lead frame (hereinafter, referred to as "Ag reflective film"), followed by a decrease in the reflection performance; or an electrical failure such as disconnection.

In this regard, hitherto, in order to enhance moisture resistance or the like, there has been proposed a method of coating this kind of phosphor with a glass material or the like (Patent Document 7, Patent Document 8, Patent Document 9, Patent Document 10, and Patent Document 11), a method of coating the surface of the phosphor particles according to a chemical gas phase reaction method (Patent Document 12), a method of attaching particles of a metal compound (Patent Document 13), or the like.

Further, Patent Document 14 discloses a ZnO compound-coated sulfur-containing phosphor having a configuration in which a ZnO compound containing Zn and O is present on the surface side of a sulfur-containing phosphor containing sulfur in a host material.

CITATION LIST

Patent Document

Patent Document 1: JP 2002-80845 A
Patent Document 2: JP 2003-41250 A
Patent Document 3: JP 2002-060747 A
Patent Document 4: JP 2007-056267 A
Patent Document 5: JP 2007-214579 A
Patent Document 6: JP 2003-64278 A
Patent Document 7: JP 2002-223008 A
Patent Document 8: JP 2004-250705 A
Patent Document 9: JP 2002-173675 A
Patent Document 10: JP 2008-7779 A
Patent Document 11: JP 2009-13186 A
Patent Document 12: JP 2005-82788 A
Patent Document 13: JP 2006-28458 A
Patent Document 14: WO 2012/077656 A1

However, it is difficult to inhibit the adverse influence of a sulfur-based gas such as hydrogen sulfide gas, sulfur dioxide gas, or carbon disulfide gas only by coating the phosphor with glass or ZnO. For example, it was found that a metallic member such as an Ag reflective film is corroded by the sulfur-based gas under long-term reliability test environments, and thus the emission maintenance factor is lowered.

In this regard, the invention relates to a sulfur-containing phosphor containing sulfur in a host material and is intended to propose a phosphor capable of effectively inhibiting the corrosion of the metallic member against the adverse influence of the sulfur-based gas for a long time while enhancing the water resistance (moisture resistance) of the phosphor.

SUMMARY OF THE INVENTION

The invention is to propose a phosphor having a configuration in which particles containing a metal borate having crystallinity (referred to as "crystalline metal borate") that contains an IIA-Group element, boron, and oxygen are present on the surface of a sulfur-containing phosphor containing sulfur in a host material.

The invention is also to propose a phosphor having a configuration in which particles containing a metal borate having crystallinity (referred to as "crystalline metal borate") that contains zinc, boron, and oxygen are present on the surface of a sulfur-containing phosphor containing sulfur in a host material.

The invention is also to propose a phosphor having a layer containing the crystalline metal borate on the surface of a surfer-containing phosphor containing sulfur in a host material.

Effect of the Invention

Since both the crystalline metal borate containing an IIA-Group element, boron, and oxygen and the crystalline metal borate containing zinc, boron, and oxygen have a feature of chemically absorbing a sulfur-based gas, if particles or a layer containing the relevant crystalline metal borates is present on the surface of the sulfur-containing phosphor, even when the sulfur-based gas is generated, the crystalline metal borates efficiently absorb the sulfur-based gas. Thus, it is possible to effectively inhibit the corrosion of the metallic member caused by the sulfur-based gas. Furthermore, since the crystalline metal borates do not absorb the light of LED or the like, brightness of the phosphor may be maintained high.

DETAILED DESCRIPTION AND MODE(S) FOR CARRYING OUT THE INVENTION

Figure 1:
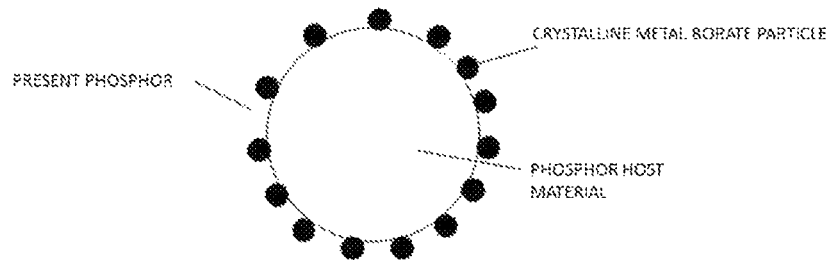
FIG. 1 is a diagram schematically illustrating an example of the cross-section state of a phosphor particle according to an embodiment of the invention.

Hereinafter, an embodiment of the invention will be described in detail. However, the scope of the invention is not limited to the embodiment described below.

(Present Phosphor)

A phosphor according to this embodiment (hereinafter, referred to as "present phosphor") is powder (hereinafter, referred to as "present phosphor powder") formed from phosphor particles (hereinafter, referred to as "present phosphor particles") having a configuration in which particles (referred to as "crystalline metal borate particles") or a layer (referred to as "crystalline metal borate layer") provided on the surface of a sulfur-containing phosphor, which contains sulfur in a host material (referred to as "phosphor host material"), and containing a crystalline metal borate containing boron, oxygen, and an IIA-Group element or zinc.

At this time, the fact that the crystalline metal borate particles or the crystalline metal borate layer is present on the surface of the phosphor host material means that the crystalline metal borate particles or the crystalline metal borate layer comes into contact with the surface of the phosphor host material so as to be present thereon.

(Phosphor Host Material)

There is no particular limitation on the specific composition of the phosphor host material of the present phosphor, that is, the host material of the sulfur-containing phosphor as long as it contains sulfur.

As a specific example of the host material of the sulfur-containing phosphor, which is favorable from the viewpoint of having a high emission brightness, for example, (Ca, Sr, Ba)S, $Ba_2ZnS_3$, (Ca, Sr, Ba)(Al, Ga, In)$_2S_4$, (Ca, Sr, Ba)$Ga_2S_4$, $BaAl_2S_4$, $Ba_2SiS_4$, and the like can be mentioned. However, the host material is not limited thereto.

On the other hand, as a luminescent center (luminescent ion) of an activation element or an co-activation element which is used in combination with such a phosphor host material, for example, ions of rare-earth metals such as Sc, Ce, Pr, Nd, Pm, Sm, Eu, Tb, Dy, Ho, Er, Tm, and Yb or ions of transition metals such as Cr, Ti, Ag, Cu, Au, Al, Mn, and Sb can be mentioned. However, the luminescent center is not limited thereto.

As a specific example of the sulfur-containing phosphor, for example, $Ba_2(Si_{1-x}Al_x)S_4$:Ce (provided that x in the formula is 0<x<1) as a blue phosphor, $SrGa_2S_4$:Eu, SrS:Tb, or CaS:Ce as a green phosphor, $CaGa_2S_4$:Eu, $Sr_2SiS_4$:Eu, CaS:Ce, or Eu as a yellow phosphor, and $(Ca_{1-x}Sr_x)S$:Eu, In (provided that x in the formula is 0 to 1) or $La_2O_2S$:Eu as a red phosphor can be mentioned. However, the sulfur-containing phosphor is not limited thereto.

Incidentally, the above-mentioned phosphors may also be used singly or in combination of two or more kinds thereof.

The particle diameter of the phosphor host material of the present phosphor is not particularly limited. For example, from the viewpoint of maintaining dispersibility in a resin, D50 based on the volume-based particle size distribution measured and obtained by a laser diffraction/diffusion particle size distribution measurement method is preferably 0.1 µm to 50 µm. From the same viewpoint, the particle diameter is more preferably 1 µm or more or 30 µm or less, and particularly preferably 2 µm or more or 20 µm or less.

When the D50 of the phosphor host material is 0.1 µm or more, luminescent efficiency is not lowered, and aggregation of phosphor particles does not occur. When the D50 is 50 µm or less, the dispersibility in the resin is maintained. Thus, unevenness in application does not occur and it is possible to prevent the inside of a coating device such as a dispenser from being blocked.

(Crystalline Metal Borate)

The crystalline metal borate may be present, as a layer of crystalline metal borate formed by continuously connecting crystalline metal borate particles, that is, as the crystalline metal borate layer, on the surface of the phosphor host material. Further, the crystalline metal borate may be present, as particles containing crystalline metal borate, that is, as the crystalline metal borate particles, on the surface of the phosphor host material.

There may exist areas on a part of the surface of the phosphor host material in which the crystalline metal borate particles or the crystalline metal borate layer is not present.

When the metal borate is crystalline, a sulfur-based gas such as hydrogen sulfide gas is trapped between crystal lattices so that a composite compound of metal and sulfur is easily generated. Therefore, the crystalline metal borate is excellent in high absorption efficiency of the sulfur-based gas.

Incidentally, whether or not the metal borate is crystalline may be determined, for example, by recognition of a diffraction peak derived from the crystalline metal borate in diffraction angle-diffraction intensity chart according to the general principle of powder X-ray diffraction analysis (JIS K 0131-1996).

The crystalline metal borate may be a metal borate having crystallinity and containing an IIA-Group element, boron, and oxygen.

Furthermore, the crystalline metal borate may be a metal borate having crystallinity (referred to as "crystalline metal borate") and containing zinc instead of the IIA-Group element or in addition to the IIA-Group element.

Examples of the IIA-Group element may include Be, Mg, Ca, Sr, Ba, and Ra.

Accordingly, as the crystalline metal borate, for example, a metal borate such as Ba—B—O, Sr—B—O, Ca—B—O, Mg—B—O, or Zn—B—O can be mentioned. Among these, from the viewpoint that a compound more stable with respect to sulfur can be formed, a metal borate such as Ba—B—O, Sr—B—O, Ca—B—O, or Zn—B—O is preferable, and of these, from the viewpoint that the influence of the sulfur-based gas can be further reduced, Ba—B—O is particularly preferable.

Incidentally, "Ba—B—O" described above means a metal borate formed from Ba, B, and O and the same applies to the other examples exemplified above.

Further, the crystalline metal borate is preferably a compound represented by Formula: $M_xB_yO_z$ (wherein x is 1 to 3, y is 2 to 6, z is 4 to 11, and M is one or two or more kinds of metal element selected from Ba, Sr, Ca, Mg, and Zn).

At this time, z/x representing the molar ratio of M and O is preferably 1.3 to 11, particularly, more preferably 2.0 or more or 10.0 or less, and particularly, even more preferably 2.5 or more or 7.0 or less.

y/x representing the molar ratio of M and B is preferably 0.5 to 6.0, particularly, more preferably 0.6 or more or 5.0 or less, and particularly, even more preferably 1.0 or more or 4.0 or less.

z/y representing the molar ratio of B and O is preferably 1.3 to 7.0, particularly, more preferably 1.70 or more or 3.0 or less, and particularly, even more preferably 1.75 or more or 2.5 or less.

As Ba—B—O described above, a compound represented by $Ba_xB_yO_z$ (x is 1 to 3, y is 2 to 4, and z is 4 to 7) can be mentioned.

At this time, z/x representing the molar ratio of Ba and O is preferably 1.3 to 7.0, particularly, more preferably 2.0 or more or 7.0 or less, and particularly, even more preferably 2.5 or more or 7.0 or less. y/x representing the molar ratio of Ba and B is preferably 0.5 to 4.0, particularly, more preferably 0.6 or more or 4.0 or less, and particularly, even more preferably 1.0 or more or 4.0 or less. z/y representing the molar ratio of B and O is preferably 1.3 to 3.5, particularly, more preferably 1.70 or more or 3.0 or less, and particularly, even more preferably 1.75 or more or 2.5 or less.

FIG. 1, FIG. 5, FIG. 6, and FIG. 7 illustrate cross-sectional schematic views in a case in which crystalline metal borate is present, as crystalline metal borate particles, on the surface of the phosphor host material.

The crystalline metal borate particles are preferably fine particles having an average particle diameter of 10 μm or less as observed by SEM. When the average particle diameter is 10 μm or less, a phenomenon that light emitted from the LED is scattered by the crystalline metal borate particles and brightness is impaired does not occur, which is favorable.

From this point of view, the average particle diameter is more preferably 1 nm or more or 5 μm or less, and particularly, is still more preferably 10 nm or more or 1 μm or less. Furthermore, in addition to this, when the point that the adsorption efficiency of hydrogen sulfide gas or the like is enhanced by sufficiently securing specific surface area and the point that aggregation between crystalline metal borate particles is prevented are taken into consideration, among the above range, the average particle diameter is particularly preferably 50 nm or more or 0.5 μm or less.

Incidentally, the average particle diameter as observed by SEM indicates the average particle diameter of any 100 particles that are observed under any 10 sections for observation. This average particle diameter can be defined by a projected area-equivalent diameter obtained by using, for example, image analysis software. When the particle has an aspect ratio, the average value of the long diameter and short diameter is taken as particle diameter of the particle.

The mass ratio between the phosphor host material and the crystalline metal borate is preferably phosphor host material:crystalline metal borate=1:0.005 to 1:1. When the ratio of the crystalline metal borate is within the above range, the hydrogen sulfide gas can be effectively adsorbed and the luminescent efficiency of the phosphor can be maintained high.

Further, from the viewpoint that the crystalline metal borate neutralizes a sulfur-based gas such as hydrogen sulfide gas or sulfur dioxide gas to inhibit the corrosion of the metallic member, the mass ratio between the phosphor host material and the crystalline metal borate is still more preferably phosphor host material:crystalline metal borate=1:0.01 to 1:0.5, and of these range, the mass ratio therebetween is particularly preferably 1:0.05 to 1:0.2.

With regard to a method of placing the crystalline metal borate particles on the surface of the sulfur-containing phosphor, a solvent evaporation method is mentioned. Specifically, powder of the crystalline metal borate is added and dispersed by ultrasonication in a solvent (for example, ethanol), powder of the sulfur-containing phosphor is added thereto and stirred, and then the solvent is evaporated to attach the crystalline metal borate particles to the surface of the sulfur-containing phosphor particles.

Further, in addition to the solvent evaporation method, a method in which powder of the sulfur-containing phosphor and powder of the crystalline metal borate are dry-blended together by using a blender or the like can be employed.

However, the invention is not limited to these methods.

After the crystalline metal borate particles are attached to the surface of the sulfur-containing phosphor particles, heating treatment may be carried out in order to completely remove the solvent or adsorbed water.

At this time, from the point that sufficient adhesion of the crystalline metal borate particles to the surface of the phosphor particles can be secured and the point that surface diffusion of sulfur components constituting the phosphor host material for maintaining sulfur gas adsorptive capacity of the crystalline metal borate is prevented, the temperature in the heating treatment is preferably 500° C. or lower, and even more preferably 300° C. or lower.

Figure 2:
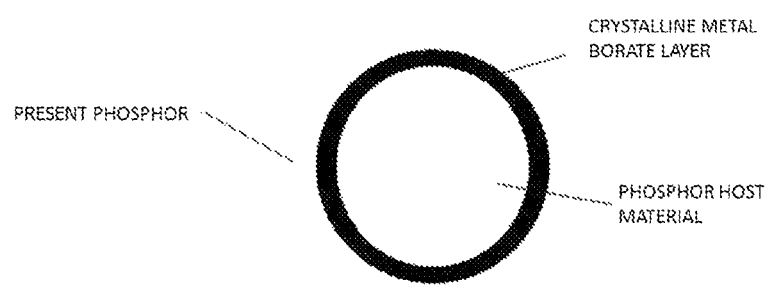
FIG. 2 is a diagram schematically illustrating an example of the cross-section state of a phosphor particle according to an embodiment of the invention.
Figure 3:
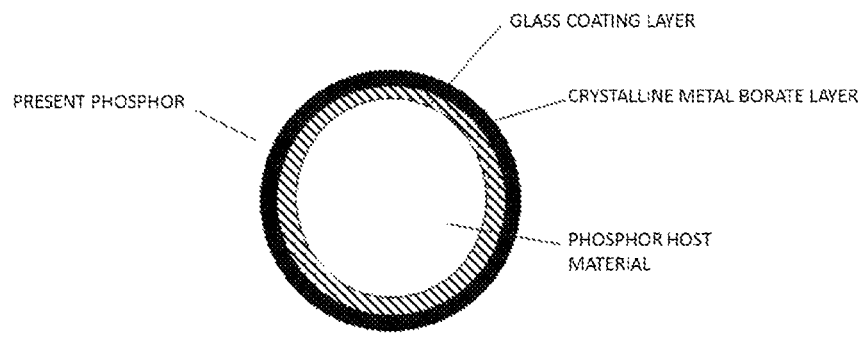
FIG. 3 is a diagram schematically illustrating an example of the cross-section state of a phosphor particle according to an embodiment of the invention.
Figure 4:
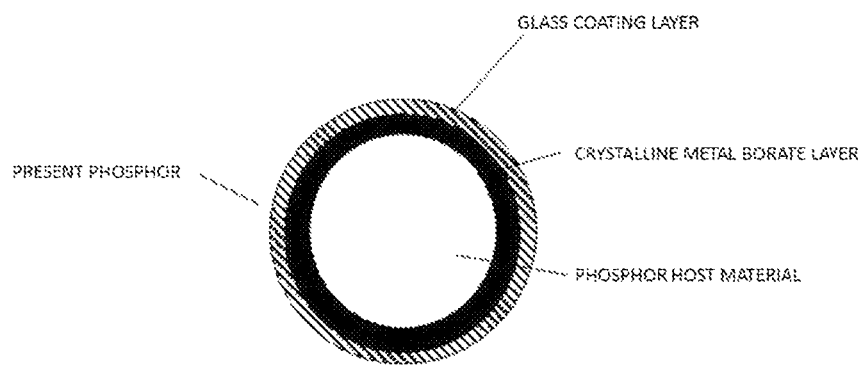
FIG. 4 is a diagram schematically illustrating an example of the cross-section state of a phosphor particle according to an embodiment of the invention.
Figure 5:
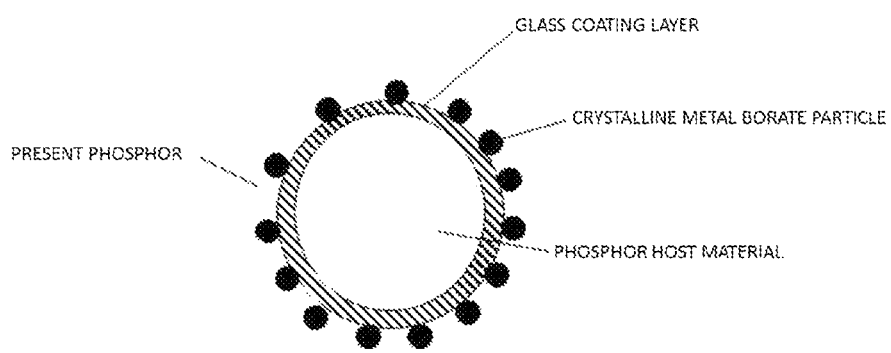
FIG. 5 is a diagram schematically illustrating an example of the cross-section state of a phosphor particle according to an embodiment of the invention.
Figure 6:
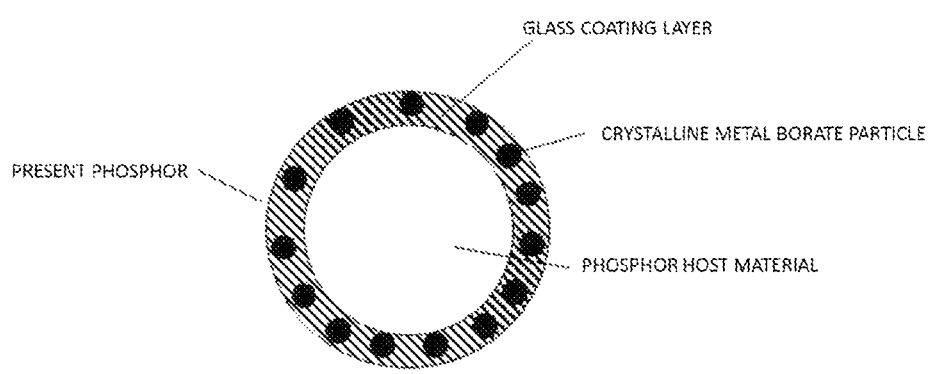
FIG. 6 is a diagram schematically illustrating an example of the cross-section state of a phosphor particle according to an embodiment of the invention.
Figure 7:
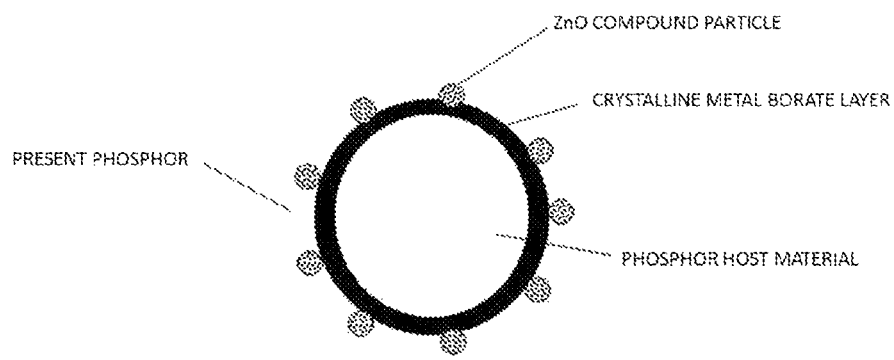
FIG. 7 is a diagram schematically illustrating an example of the cross-section state of a phosphor particle according to an embodiment of the invention.

FIG. 2, FIG. 3, and FIG. 4 illustrate cross-sectional schematic views in a case in which crystalline metal borate is present, as a crystalline metal borate layer, on the surface of the phosphor host material.

The surface of the phosphor host material may be completely coated with the crystalline metal borate layer or the surface of the phosphor host material may be coated with the crystalline metal borate layer such that a part of the surface of the phosphor host material is exposed.

At this time, the coverage of the crystalline metal borate layer is preferably 20% or less, and particularly, is preferably 10% or less.

Incidentally, the coverage can be calculated by image analysis from two-dimensional mapping measurement by a cathodoluminescence method. That is, a non-coated portion (a portion of which the surface of the phosphor host material is exposed) emits light by electron beam excitation and the coated portion does not emit light. Based on these points, the coverage can be calculated by the following equation.

Coverage (%)=area of non-light-emitting portion/ (area of light-emitting portion+area of non-light-emitting portion)

The thickness of the crystalline metal borate layer is preferably 5 nm to 300 nm.

Examples of the method for forming the crystalline metal borate layer may include chemical gas phase reaction methods such as a plasma CVD method, a metalorganic chemical vapor deposition method (MOCVD method), a laser CVD method, and an atomic layer epitaxy method (ALE).

(Glass Coating Layer)

The present phosphor may be further provided with a glass coating layer on the surface of the phosphor host material. FIGS. 3 to 6 are cross-sectional schematic views illustrating a state in which the present phosphor is provided with such a glass coating layer. This glass coating layer may provide moisture resistance to the present phosphor, additionally.

For example, with regard to the form provided with the glass coating layer, it is possible to employ the form having a configuration in which the crystalline metal borate particles or the crystalline metal borate layer is present on the surface of the phosphor host material and the glass coating layer is present to cover the crystalline metal borate particles or the crystalline metal borate layer, or the form having a configuration in which the glass coating layer is present on the surface of the phosphor host material and the crystalline metal borate particles or the crystalline metal borate layer is present on the surface of the glass coating layer. Further, the present phosphor may be provided with three or more coating layers. Furthermore, a configuration in which the crystalline metal borate particles are present in the glass coating layer may be employed.

Among them, the glass coating layer is preferably present at the phosphor host side as compared with a case in which the crystalline metal borate particles or the crystalline metal borate layer is present at the phosphor host material side. This is because a case in which the crystalline metal borate may become amorphous due to heating performed when the glass coating layer is formed is prevented from occurring.

Any glass coating layer may be used as long as it contains a glass composition. For example, a layer that contains a glass composition containing an amorphous oxide may be used. Examples include glass compositions containing a composition such as $SiO_2$, $Ma_2O_3$, $Ma_2O_3$—$SiO_2$, $Ma_2O_3$-MbO, $Ma_2O_3$—$MdO_2$, $Ma_2O_3$-MbO—$SiO_2$, MbO—$MdO_2$—$SiO_2$, MbO-$Mc_2O$—$SiO_2$, $Ma_2O_3$-MbO-$Mc_2O$, $Ma_2O_3$-MbO—$MdO_2$, or $Ma_2O_3$-MbO-$Mc_2O$—$SiO_2$ (incidentally, "Ma" represents at least one or more combinations selected from an IIIA-Group metal of aluminum group or an IIIB-Group metal of rare earth group, such as B or Al, and Bi; "Mb" represents at least one or more combinations selected from an alkaline earth metal and Zn; "Mc" represents at least one or more combinations selected from alkali metals; and "Md" represents at least one or more combinations selected from IVB Group of titanium group). However, the invention is not limited thereto.

The glass coating layer may contain $B_2O_3$, an alkali metal, an alkaline earth metal, fluorine, or a fluoride, as a component for lowering the softening point or the glass transition temperature of the glass composition. Regarding the fluoride at this time, the glass coating layer may preferably contain fluorides of one or two or more kinds selected from the group consisting of Ca, Sr, Ba, Mg, Zn, Al, and Ga, and more preferably, the glass coating layer may contain fluorides of one or two or more kinds selected from the group consisting of Ca, Sr, Ba, and Mg. However, the invention is not limited thereto.

As an example of the glass coating layer, a glass coating layer formed by an aggregate of glass particles can be mentioned. Specifically, a glass coating layer can be formed on the surface of phosphor particles by dispersing phosphor particles and glass particles in ethanol, and then evaporating ethanol.

At this time, a preferred example of the composition range of the glass composition, for example, glass particles, may be a composition containing, as molar ratios, Si=0.45 to 0.55, Ba=0.07 to 0.16, B=0.13 to 0.21, Al=0.11 to 0.20, and F=0.03 to 0.10. More preferably, a composition containing, as molar ratios, Si=0.48 to 0.51, Ba=0.10 to 0.13, B=0.16 to 0.18, Al=0.14 to 0.17, and F=0.04 to 0.08 may be used.

As an example of a specific production method for glass particles, for example, the glass particles can be obtained by mixing $SiO_2$, BaO, $B_2O_3$, and $Al_2O_3$ as main raw materials, with at least one selected from $BaF_2$, $AlF_3$, $Na_3AlF_6$, and $(NH_4)_3AlF_6$ as a fluorine-adding component, heating a mixture thus obtained in a temperature range of 1050° C. to 1400° C. for 30 minutes to 120 minutes, rapidly cooling the mixture in air or in water, and pulverizing the glass composition thus obtained to a particle size of 1 μm or less. At this time, there are no particular limitations on the pulverization method. For example, pulverization can be carried out by a dry method, a wet method, or a combination of these, and regarding a pulverization apparatus, for example, a vibrating mill, a bead mill, an attritor, a jet mill, and the like can be used in combination. However, the invention is not intended to be limited to such a production method.

As another aspect of the glass coating layer, a glass coating film can be mentioned.

As an example of the method for forming such a glass coating film, for example, there may be a method in which a precursor mixture including a precursor of the glass coating layer, water, and a solvent is prepared, the precursor mixture and phosphor particles are mixed, a sol-gel reaction is induced, the surface of the phosphor host material is coated with glass, subsequently only the phosphor particles having a glass coating layer formed thereon is obtained by separation by filtration, and then the phosphor particles are dried. Further, as necessary, heat treatment may be additionally performed after drying.

In addition, as another method for forming a glass forming film, for example, there may be a method in which phosphor particles and powder of a glass composition are mixed, the mixture of the powder of the glass composition and the phosphor particles is subjected to heat treatment such that the powder of the glass composition melts and surrounds the phosphor particles, and then the mixture is cooled. As an example of the powder of the glass composition in this case, compositions such as $SiO_2$—$B_2O_3$, ZnO—$B_2O_3$, $Bi_2O_3$—$B_2O_3$, ZnO—$SiO_2$—$B_2O_3$, $Bi_2O_3$—ZnO—$B_2O_3$, $SiO_2$—$B_2O_3$—$Al_2O_3$, $SiO_2$—$B_2O_3$—BaO, and $SiO_2$—$B_2O_3$—BaO—$Al_2O_3$ can be mentioned.

In addition to that, a method of coating the surface of the phosphor particles according to the above-mentioned chemical gas phase reaction method as a continuous glass composition layer, a method of attaching glass composition particles, or the like may also be employed.

It is more preferable that the glass coating layer be continuous in view of maintaining fluorescence of the phosphor. However, if the glass coating layer is continuous, there may exist areas on a part of the surface of the phosphor in which the glass coating layer is not attached, and the phosphor surface is exposed.

Incidentally, with only one layer of the glass coating layer, corrosion of the Ag reflective film can be prevented. Furthermore, the inhibition effect of corrosion of the Ag reflective film can be further enhanced by forming a layer in which crystalline metal borate, a metal oxide layer including a crystalline ZnO compound to be described later, and the like are combined on the surface of the phosphor.

Incidentally, the glass coating layer may be a porous glass coating layer.

(ZnO Compound Particles or Layer)

The present phosphor may further include particles or a layer containing a crystalline ZnO compound (referred to as "ZnO compound particles" or "ZnO compound layer") on the surface of the phosphor host material.

With regard to the form of having the ZnO compound layer on the surface of the phosphor host material, for example, it is possible to employ a form having a configuration in which crystalline metal borate particles or a crystalline metal borate particle layer is present on the surface of the phosphor host material, ZnO compound particles or a ZnO compound layer is present at the outer side thereof, and as necessary, a glass coating layer is present so as to coat the ZnO compound particles or the ZnO compound layer, or a form having a configuration in which ZnO compound particles or a ZnO compound layer is present on the surface of the phosphor host material, crystalline metal borate particles or a crystalline metal borate particle layer is present at the outer side thereof, and as necessary, a glass coating layer is present so as to coat the crystalline metal borate particles or the crystalline metal borate particle layer. Furthermore, it is possible to employ a form having a configuration in which a glass coating layer is present so as to coat the surface of the phosphor host material, crystalline metal borate particles or a crystalline metal borate particle layer is present on the surface thereof, and ZnO compound particles or a ZnO compound layer is present at the outer side thereof, or a form having a configuration in which a glass coating layer is present so as to coat the surface of the phosphor host material, ZnO compound particles or a ZnO compound layer is present on the surface thereof, and crystalline metal borate particles or a crystalline metal borate particle layer is present at the outer side thereof.

The ZnO compound has a feature that it reacts with hydrogen sulfide gas, and a feature that it does not absorb the light of LED or the like and does not affect the color, in other words, it is colorless and transparent, as long as the ZnO compound contains Zn and O. Therefore, regarding the ZnO compound, there is no particular limitation on the specific composition thereof. For example, as the ZnO compound containing Zn and O, one or two or more kinds of crystalline fine particles selected from the group consisting of ZnO, $Zn(OH)_2$, $ZnSO_4 \cdot nH_2O$ ($0 \leq n \leq 7$), $ZnTi_2O_4$, $Zn_2Ti_3O_8$, $Zn_2TiO_4$, $ZnTiO_3$, $ZnBaO_2$, $ZnBa_2O_3$, $ZnGa_2O_4$, $Zn_{1.23}Ga_{0.28}O_2$, $Zn_3GaO_4$, $Zn_6Ga_2O_9$, $Zn_{0.125-0.95}Mg_{0.05-0.9}O$, $Zn_{0.1-0.75}Ca_{0.25-0.9}O$, $ZnSrO_2$, $Zn_{0.3}Al_{2.4}O_4$, $ZnAl_2O_4$, $Zn_{3-7}In_2O_{6-10}$, $ZnSnO_3$, and $Zn_2SnO_4$ can be mentioned, and other compositions may be mentioned.

The ZnO compound may be present, as a layer of the ZnO compound in which ZnO compound particles are continuously connected, on the surface of the phosphor host material, and may be present, as ZnO compound particles, on the surface of the phosphor host material. If the ZnO compound is present, as ZnO compound particles, on the surface of the phosphor host material, it is confirmed that the influence of the hydrogen sulfide gas can be reduced.

In addition, there may exist areas on a part of the surface of the phosphor host material in which the ZnO compound particles or the ZnO compound layer is not present.

It is preferable that there be no chemical bond between sulfur of the phosphor host material and the ZnO compound. It is because when these components are chemically bonded so that S of the phosphor host material and Zn of the ZnO compound are reacted with each other to generate ZnS, the reaction with hydrogen sulfide gas is inhibited, and also, this becomes a new factor causing the corrosion of the Ag reflective film. Therefore, it is preferable that the ZnO compound be physically attached to the surface of the phosphor host material.

The ZnO compound particle is preferably fine particles having an average particle diameter of 300 nm or less as observed by SEM, and particularly, the average particle diameter is more preferably 1 nm or more or 100 nm or less. When the average particle diameter is 300 nm or less, light emitted from the LED is not scattered by the ZnO compound particle and absorption of light emitted from the LED by the phosphor is not inhibited, which is favorable. Further, since the purpose of applying the ZnO compound is to adsorb the hydrogen sulfide gas, and from this point of view, it is also preferable that the ZnO compound have a large specific surface area. It can be said that the average particle diameter is even more preferably 100 nm or less.

Incidentally, the average particle diameter as observed by SEM indicates the average particle diameter of any 100 particles that are observed under any 10 sections for observation. This average particle diameter can be defined by a projected area-equivalent diameter obtained by using, for example, image analysis software. When the particle has an aspect ratio, the average value of the long diameter and short diameter is taken as particle diameter of the particle.

The mass ratio between the phosphor and the ZnO compound is preferably sulfur-containing phosphor:ZnO compound=1:0.005 to 1:1. When the ratio of the ZnO compound is within the above range, not only the hydrogen sulfide gas adsorption effect can be obtained but also the luminescent efficiency of the phosphor can be maintained without interfering light emission by phosphor after it absorbs light emitted from the LED. From this point of view, particularly, the mass ratio is preferably sulfur-containing phosphor:ZnO compound=1:0.01 to 1:0.5, and even more preferably 1:0.02 to 1:0.3.

With regard to a method of placing the ZnO compound particles on the surface of the sulfur-containing phosphor, it is possible that powder of the ZnO compound is added and dispersed by ultrasonication in a solvent (for example, ethanol), powder of the sulfur-containing phosphor is added thereto and stirred, and then the solvent is evaporated to attach the ZnO compound to the surface of the sulfur-containing phosphor particles.

Further, it is also possible that powder of the sulfur-containing phosphor and powder of the ZnO compound are dry-blended together by using a blender or the like for attaching the ZnO compound particles to the surface of the sulfur-containing phosphor particles.

As additional method for forming the ZnO compound layer on the surface of the sulfur-containing phosphor, for example, a method such as a chemical gas phase reaction method can be mentioned.

(Others)

The surface of the present phosphor may be subjected to surface treatment with an organic coupling agent, and may be subjected to surface treatment with a material having intermediate physical properties of an inorganic silica and an organic silicone, such as silsesquioxane.

The present phosphor may be appropriately mixed with, if necessary, various additives such as a plasticizer, a pigment, an anti-oxidant, a heat stabilizer, a UV absorbing agent, a light stabilizer, a flame retardant, a lubricating agent, a foaming agent, a filler, an anti-static agent, and a reinforcement material such as fiber.

Figure 8:
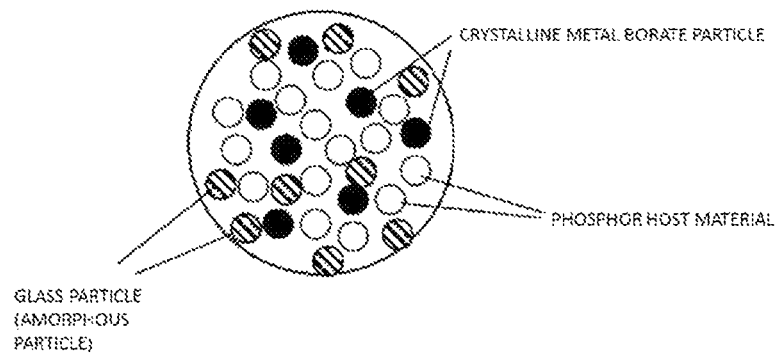
FIG. 8 is a diagram schematically illustrating an example of the cross-section state of a phosphor particle as a reference example.
Figure 9:
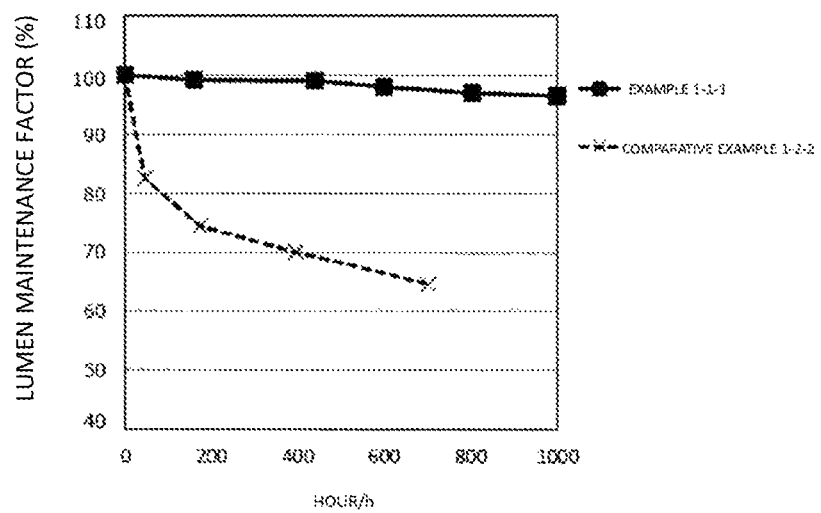
FIG. 9 is a graph illustrating the changes over time in a lumen maintenance factor (%) respectively evaluated for the phosphor powders obtained in Example 1-1-1 and Comparative Example 1-2-2, using LED packages.

Incidentally, as illustrated in FIG. 8, a case in which sulfur-containing phosphor particles, that is, the phosphor host material of the present phosphor, the crystalline metal borate, the glass particles as necessary, and ZnO compound particles as necessary exist in mixture and form an aggregate can be supposed.

<Form of Present Phosphor>

The present phosphor may be powder or a molded body. However, in order to obtain a molded body by mixing with a resin, the present phosphor is preferably powder.

Further, the present phosphor may have a configuration in which the luminescent layer containing the present phosphor is disposed in a sealing layer formed from a transparent resin composition or a glass composition.

In a case in which the present phosphor is powder, from the viewpoint of dispersibility, the median particle diameter (D50) based on volume-based particle size distribution that is measured and obtained by a laser diffraction/diffusion particle size distribution measurement method is preferably 0.1 μm to 100 μm, more preferably 1 μm or more or 50 μm or less, and particularly preferably 2 μm or more or 20 μm or less. When the D50 is 0.1 μm or more, luminescent efficiency does not tend to be lowered, and aggregation of phosphor particles does not occur. In addition, when the D50 is 100 μm or less, the dispersibility can be maintained. Thus, it is possible to prevent unevenness in application and blockage of a dispenser or the like in the producing step.

Incidentally, the median particle diameter (D50) of the present phosphor can be adjusted by adjusting the particle diameter of a raw material of the host material, that is, the particle diameter of a Ca raw material, and thus may be adjusted according to the use of the present phosphor.

<Use of Present Phosphor>

The present phosphor can be suitably used as, for example, a wavelength conversion material for an LED, a laser, a diode, or the like.

For example, a luminescent device and a luminescent unit can be configured by disposing the present phosphor in the vicinity of the light emission source such as an LED, a laser, or a diode, and the present phosphor can be used in various applications. As such, when the present phosphor may be disposed in the vicinity of an LED, the present phosphor can be utilized in, for example, light devices and special light sources, as well as in the backlight of image display devices such as liquid crystal display devices.

Further, an LED or the like of the light emission source can be used by replacing with an organic EL (OLED).

Furthermore, the present phosphor can be utilized in display devices such as EL and FED by disposing an electric field source or an electron source in the vicinity of the present phosphor.

Incidentally, the vicinity of a luminous body refers to a position at which the light emitted by the luminous body can be received.

Of them, the present phosphor is effective in terms that the adverse influence of the hydrogen sulfide gas can be effectively inhibited, and luminescent efficiency is maintained high by disposing the present phosphor as a phosphor-containing layer on a metallic member as a reflective film.

At this time, as the solid luminescent device, an LED, a laser, a diode, or the like can be mentioned. As the metallic member as a reflective film, silver, copper, nickel, iron, or an alloy using these metals as constituent elements can be mentioned. Of them, in terms of maintaining high thermal conductivity, silver and copper are preferable, and in terms of maintaining high thermal conductivity and reflectance of visible light, silver is more preferable.

With regard to the phosphor-containing layer, a phosphor-containing layer in which the present phosphor is contained in a resin can be exemplified, and a phosphor-containing layer having a configuration in which the present phosphor and the ZnO compound are scattered in a resin can be exemplified.

Further, a phosphor molded body having a configuration in which the luminescent layer containing the present phosphor is disposed in a sealing layer formed from a transparent resin composition or a glass composition can also be produced. For example, a phosphor molded body is formed, which has a configuration in which luminescent layers are formed by providing plural recessed grooves at appropriate intervals on the back surface side of a sheet body formed from a transparent resin composition or a glass composition, and embedding a phosphor-containing resin composition obtained by incorporating the present phosphor in a transparent resin, into the respective recessed grooves. On the back surface side (opposite side of the viewing side) of the relevant phosphor molded body, light sources such as LEDs are disposed on the back surface side of the respective phosphor layers. Thus, a luminescent unit can be produced, and this can be used in an image display device or the like.

Further, a solar power generation apparatus, which includes a phosphor molded body that receives light including at least light in the ultraviolet region or light in the near-ultraviolet region in sunlight or contains a phosphor and a solar cell that receives light in the visible light region that has been emitted by the phosphor and converts the light to an electric signal, can be configured by using the present phosphor.

That is, since the present phosphor is excited, as described above, by light having a wavelength in the ultraviolet range to the visible light range (for example, 250 nm to 610 nm) and can emit light in the visible light range, particularly red light depending on composition, the present phosphor can be used in a solar power generation apparatus by utilizing this characteristic. For example, a solar power generation apparatus, which includes the present phosphor that receives light including at least light in the ultraviolet region or light in the near-ultraviolet region in sunlight, and emits light in the visible light region and a solar cell that receives light in the visible light region that has been emitted by the present phosphor and converts the light to an electric signal, can be configured.

In the case of a solar cell formed from single crystal silicon or the like, it is general that although the solar cell is excited upon receiving light in the visible light region, the solar cell is not excited even upon receiving light in the ultraviolet region or light in the near-ultraviolet region. Therefore, the power generation efficiency can be increased by converting light in the ultraviolet region or light in the near-ultraviolet region to visible light by utilizing the phosphor, and supplying the visible light to the solar cell.

Therefore, for example, a solar power generation apparatus including a filter mirror, the present phosphor, a semiconductor thermoelectric element, and a solar cell can be configured such that sunlight is spectrally dispersed by the filter mirror into the infrared region (for example, 1000 nm or more), the visible light/near-infrared region (for example, 450 to 1000 nm), and the ultraviolet/blue region (250 to 450 nm), the light of the infrared region is irradiated to a semiconductor thermoelectric element to heat the element, the relevant light of the ultraviolet/blue region is irradiated to the present phosphor to be converted to light of the visible light region, and this light is irradiated to the solar cell together with the light of the visible light that has been spectrally dispersed by the filter mirror.

In this case, the phosphors can be formed as a filter mirror by coating a light condensing surface or a heat collector pipe.

<Description of Terms>

The "luminescent device" in the invention is intended to mean a light-emitting device that emits light and includes at least a phosphor such as a red phosphor and a light emission source or an electron source as an excitation source thereof.

The "luminescent unit" is intended to mean a light-emitting device that emits relatively large-sized light and includes at least a phosphor and a light emission source or an electron source as an excitation source thereof in a luminescent device.

For both the "luminescent device" and the "luminescent unit," the disposition of the phosphor inside a device or a unit is not intended to be particularly limited.

When the expression "X to Y" (X and Y are arbitrary numbers) is used in the invention, unless particularly stated otherwise, the expression includes the meaning of "more than or equal to X and less than or equal to Y," as well as the meaning of "preferably more than X" or "preferably less than Y."

Further, when the expression "more than or equal to X" (X is an arbitrary number) is used in the invention, unless particularly stated otherwise, the expression includes the meaning of "preferably more than X," and "more than or equal to Y" (Y is an arbitrary number) is used in the invention, unless particularly stated otherwise, the expression includes the meaning of "preferably less than Y."

EXAMPLES

Hereinafter, Examples of the invention will be described. However, the invention is not intended to be limited to these Examples.

Comparative Example 1: Synthesis of CaS:$Eu^{2+}$ ($Ca_{0.99}Eu_{0.01}S$) Phosphor CaS and EuS as a starting material were weighed and mixed so as to yield the target composition, and mixed for 100 minutes with a paint shaker using φ 3 mm zirconia balls as media. The obtained mixture was calcined in a hydrogen sulfide atmosphere at 1100° C. for 6 hours. Next, the calcined product was crushed for 1 minute with a mortar and pestle machine ("ALM-360T" manufactured by NITTO KAGAKU Co., Ltd.), and using sieves with 140 mesh and 440 mesh openings, the material under the sieve with 140 mesh opening and above the sieve with 440 mesh opening was recovered to obtain phosphor powder (sample) formed from CaS:$Eu^{2+}$.

Comparative Example 1-1: Coating With $ZnO-B_2O_3$-Based Glass

ZnO and $B_2O_3$ were weighed, mixed using a mortar, and then transferred to a platinum crucible.

After the mixture was sufficiently melted by an electric furnace set at 1600° C., the crucible was taken out from the furnace and the molten body was allowed to flow on a stainless steel plate and cooled to obtain a $ZnO-B_2O_3$-based glass.

The obtained glass was pulverized using a tungsten mortar and then further pulverized using an alumina mortar.

The obtained glass powder was put into a polyethylene pot along with zirconia beads and ethanol and further pulverized using a bead mill. The slurry was taken out from the pot along with the beads and the beads were removed to obtain a slurry in which glass powder was suspended in ethanol.

The CaS:Eu phosphor obtained in Comparative Example 1 (100 parts by mass) was put into an evaporator, and the slurry was further added thereto such that the glass powder became 10 parts by mass. The resultant mixture was evaporated by dryness to obtain a CaS:Eu phosphor attached with $ZnO-B_2O_3$ glass powder thereto.

The phosphor attached with the glass powder thereto was charged into an alumina boat and calcination was performed in air at 750° C. to obtain a $ZnO-B_2O_3$-based glass-coated CaS:Eu phosphor (referred to as "glass-coated phosphor of Comparative Example 1-1," sample).

Comparative Example 1-1-1: Coating With $Na_2B_4O_7$ $NaCO_3$ and $B_2O_3$ were weighed, mixed using a mortar, and then transferred to an alumina boat. The mixture was calcined by an electric furnace set at 900° C. to obtain crystalline $Na_2B_4O_7$.

The obtained $Na_2B_4O_7$ was pulverized using an alumina mortar, and the obtained powder was put into a PE resin pot along with zirconia beads and ethanol and further pulverized using a bead mill. The slurry was taken out from the pot along with the beads and the beads were removed to obtain a slurry in which $Na_2B_4O_7$ powder was suspended in ethanol.

Next, the glass-coated phosphor obtained in Comparative Example 1-1 (100 parts by mass) was put into an evaporator, and the slurry was further added thereto such that $Na_2B_4O_7$ became 5 parts by mass. The resultant mixture was evaporated by dryness to obtain a $ZnO-B_2O_3$ glass-coated phosphor (sample) attached with $Na_2B_4O_7$ particles to the outermost surface thereof.

Comparative Example 1-2-1: Coating With $SiO_2$ Glass

The CaS:Eu phosphor powder obtained in Comparative Example 1 (100 parts by mass) was added to ethanol and suspended, deionized water and $Si(OEt)_4$ equivalent to 10 parts by mass of glass powder were added thereto, a small amount of ammonia water was further added as a catalyst, and hydrolysis at 60° C. was carried out to obtain a $SiO_2$ glass-coated CaS:Eu phosphor (referred to as "glass-coated phosphor of Comparative Example 1-2-1," sample).

Comparative Example 1-2-2: Coating With $SiO_2$ Glass/ZnO Compound

Into an eggplant-shaped flask, 10 parts by mass of crystalline ZnO particles (average particle diameter of 30 nm) with respect to the glass phosphor of Comparative Example 1-2-1 (100 parts by mass) was introduced along with 50 mL of ethanol, and ZnO was dispersed in ethanol with an ultrasonic cleaning device. $SiO_2$-based glass-coated CaS:Eu phosphor powder was added thereto, and ethanol was evaporated with a rotary evaporator to obtain a $SiO_2$-based glass/ZnO-coated CaS:Eu phosphor (referred to as "glass/ZnO-coated phosphor of Comparative Example 1-2-2," sample).

Comparative Example 1-3: Coating With ZnO Compound

Into an eggplant-shaped flask, 20 parts by mass of crystalline ZnO particles (average particle diameter of 30 nm) with respect to the CaS:Eu phosphor powder obtained in Comparative Example 1 (100 parts by mass) was introduced along with 50 mL of ethanol, and ZnO was dispersed in ethanol with an ultrasonic cleaning device. While the resultant material was stirred with a rotary evaporator, ethanol was evaporated to obtain a ZnO-coated CaS:Eu phosphor (sample).

Example 1: Coating With $BaB_4O_7$ $BaCO_3$ and $B_2O_3$ were weighed, mixed using a mortar, and then transferred to an alumina boat.

The mixture was calcined by an electric furnace set at 900° C. to obtain crystalline $BaB_4O_7$.

The obtained $BaB_4O_7$ was pulverized using an alumina mortar, and the obtained powder was put into a PE resin pot along with zirconia beads and ethanol and further pulverized using a bead mill. The slurry was taken out from the pot along with the beads and the beads were removed to obtain a slurry in which $BaB_4O_7$ powder was suspended in ethanol.

The phosphor obtained in Comparative Example 1 (100 parts by mass) was put into a rotary evaporator, and the slurry was further added thereto such that $BaB_4O_7$ became 5 parts by mass. The resultant mixture was evaporated by dryness to obtain a phosphor (sample) attached with $BaB_4O_7$ particles to the outermost surface thereof.

Example 1-1-1: Coating With $BaB_4O_7$ $BaCO_3$ and $B_2O_3$ were weighed, mixed using a mortar, and then transferred to an alumina boat. The mixture was calcined by an electric furnace set at 900° C. to obtain crystalline $BaB_4O_7$.

The obtained $BaB_4O_7$ was pulverized using an alumina mortar, and the obtained powder was put into a PE resin pot along with zirconia beads and ethanol and further pulverized using a bead mill. The slurry was taken out from the pot along with the beads and the beads were removed to obtain a slurry in which $BaB_4O_7$ powder was suspended in ethanol.

The glass-coated phosphor of Comparative Example 1-1 (100 parts by mass) was put into a rotary evaporator, and the slurry was further added thereto such that $BaB_4O_7$ became 5 parts by mass. The resultant mixture was evaporated by dryness to obtain a ZnO—$B_2O_3$ glass-coated phosphor (sample) attached with $BaB_4O_7$ particles to the outermost surface thereof.

Example 1-1-2: Coating With $BaB_2O_4$ $BaCO_3$ and $B_2O_3$ were weighed, mixed using a mortar, and then transferred to an alumina boat. The mixture was calcined by an electric furnace set at 900° C. to obtain crystalline $BaB_2O_4$.

The obtained $BaB_2O_4$ was pulverized using an alumina mortar, and the obtained powder was put into a PE resin pot along with zirconia beads and ethanol and further pulverized using a bead mill. The slurry was taken out from the pot along with the beads and the beads were removed to obtain a slurry in which $BaB_2O_4$ powder was suspended in ethanol.

The glass-coated phosphor of Comparative Example 1-1 (100 parts by mass) was put into an evaporator, and the slurry was further added thereto such that $BaB_2O_4$ became 5 parts by mass. The resultant mixture was evaporated by dryness to obtain a ZnO—$B_2O_3$ glass-coated phosphor (sample) attached with $BaB_2O_4$ particles to the outermost surface thereof.

Example 1-1-3: Coating With $Ba_2B_2O_5$ $BaCO_3$ and $B_2O_3$ were weighed, mixed using a mortar, and then transferred to an alumina boat. The mixture was calcined by an electric furnace set at 900° C. to obtain crystalline $Ba_2B_2O_5$.

The obtained $Ba_2B_2O_5$ was pulverized using an alumina mortar, and the obtained powder was put into a PE resin pot along with zirconia beads and ethanol and further pulverized using a bead mill. The slurry was taken out from the pot along with the beads and the beads were removed to obtain a slurry in which $Ba_2B_2O_5$ powder was suspended in ethanol.

The glass-coated phosphor of Comparative Example 1-1 (100 parts by mass) was put into a rotary evaporator, and the slurry was further added thereto such that $Ba_2B_2O_5$ became 5 parts by mass. The resultant mixture was evaporated by dryness to obtain a ZnO—$B_2O_3$ glass-coated phosphor (sample) attached with $Ba_2B_2O_5$ particles to the outermost surface thereof.

Example 1-1-4: Coating With $Ba_3B_2O_6$ $BaCO_3$ and $B_2O_3$ were weighed, mixed using a mortar, and then transferred to an alumina boat. The mixture was calcined by an electric furnace set at 900° C. to obtain crystalline $Ba_3B_2O_6$.

The obtained $Ba_3B_2O_6$ was pulverized using an alumina mortar, and the obtained powder was put into a PE resin pot along with zirconia beads and ethanol and further pulverized using a bead mill. The slurry was taken out from the pot along with the beads and the beads were removed to obtain a slurry in which $Ba_3B_2O_6$ powder was suspended in ethanol.

The glass-coated phosphor of Comparative Example 1-1 (100 parts by mass) was put into an evaporator, and the slurry was further added thereto such that $Ba_3B_2O_6$ became 5 parts by mass. The resultant mixture was evaporated by dryness to obtain a ZnO—$B_2O_3$ glass-coated phosphor (sample) attached with $Ba_3B_2O_6$ particles to the outermost surface thereof.

Examples 1-1-5 to 1-1-7: Coating With Various Kinds of Crystalline Metal Borate

In Example 1-1-5, $MgCO_3$ and $B_2O_3$ were weighed, mixed using a mortar, and then transferred to an alumina boat. The mixture was calcined by an electric furnace set at 900° C. to obtain crystalline $Mg_2B_3O_{11}$.

In Example 1-1-6, $CaCO_3$ and $B_2O_3$ were weighed, mixed using a mortar, and then transferred to an alumina boat. The mixture was calcined by an electric furnace set at 900° C. to obtain crystalline $CaB_2O_4$.

In Example 1-1-7, $SrCO_3$ and $B_2O_3$ were weighed, mixed using a mortar, and then transferred to an alumina boat. The mixture was calcined by an electric furnace set at 900° C. to obtain crystalline $Sr_2B_2O_5$.

The crystalline metal borate obtained as described above was pulverized using an alumina mortar, and the obtained powder was put into a PE resin pot along with zirconia beads and ethanol and further pulverized using a bead mill. The slurry was taken out from the pot along with the beads and the beads were removed to obtain a slurry in which $BaB_4O_7$ powder was suspended in ethanol.

The glass-coated phosphor of Comparative Example 1-1 (100 parts by mass) was put into a rotary evaporator, and the slurry was further added thereto such that the crystalline metal borate became 5 parts by mass. The resultant mixture was evaporated by dryness to obtain a $ZnO$—$B_2O_3$ glass-coated phosphor (sample) attached with the crystalline metal borate particles to the outermost surface thereof.

Example 1-2: Coating With $BaB_4O_7$

A $SiO_2$-based glass/ZnO-coated phosphor (sample) attached with $BaB_4O_7$ particles to the outermost surface thereof was obtained in the same manner as in Example 1-1-1, except that the glass/ZnO-coated phosphor of Comparative Example 1-2-2 was used instead of the glass-coated phosphor of Comparative Example 1-1 used in Example 1-1-1.

Example 1-3: Coating With $BaB_4O_7$

The glass-coated phosphor of Comparative Example 1-1 (100 parts by mass) was added to ethanol, suspended, and then added to a rotary evaporator such that $SiO_2$ glass powder became 5 parts by mass. The resultant mixture was evaporated by dryness to obtain a $ZnO$—$B_2O_3$—$SiO_2$-based glass-coated CaS:Eu phosphor.

Further, the $ZnO$—$B_2O_3$—$SiO_2$-based glass-coated CaS:Eu phosphor (100 parts by mass) was put into the evaporator and the slurry was further added such that $BaB_4O_7$ became 5 parts by mass. The resultant mixture was evaporated by dryness to obtain a $ZnO$—$B_2O_3$—$SiO_2$-based glass-coated phosphor (sample) attached with $BaB_4O_7$ particles to the outermost surface thereof.

Example 1-4

Phosphor powder formed from $SrS:Eu^{2+}$ was obtained in the same manner as in Comparative Example 1, except that SrS was used as a starting material instead of CaS.

Next, a $ZnO$—$B_2O_3$-based glass-coated SrS:Eu phosphor was obtained in the same manner as in Comparative Example 1-1, except that the SrS:Eu phosphor (100 parts by mass) was used instead of the CaS:Eu phosphor (100 parts by mass).

Next, the $ZnO$—$B_2O_3$-based glass-coated SrS:Eu phosphor (100 parts by mass) was added to ethanol, suspended, and then added to a rotary evaporator such that $SiO_2$ glass powder became 5 parts by mass. The resultant mixture was evaporated by dryness to obtain a $ZnO$—$B_2O_3$—$SiO_2$-based glass-coated SrS:Eu phosphor.

Further, the $ZnO$—$B_2O_3$—$SiO_2$-based glass-coated SrS:Eu phosphor (100 parts by mass) was put into the evaporator and the slurry was further added such that $BaB_4O_7$ became 5 parts by mass. The resultant mixture was evaporated by dryness to obtain a $ZnO$—$B_2O_3$—$SiO_2$-based glass-coated phosphor (sample) attached with $BaB_4O_7$ particles to the outermost surface thereof.

Example 1-5

Phosphor powder formed from $Ca_{0.2}Sr_{0.8}S:Eu^{2+}$ was obtained in the same manner as in Comparative Example 1, except that CaS and SrS were used as a starting material.

Next, a $ZnO$—$B_2O_3$—$SiO_2$-based glass-coated phosphor (sample) attached with $BaB_4O_7$ particles to the outermost surface thereof was obtained in the same manner as in Example 1-4, except that the $Ca_{0.2}Sr_{0.8}S:Eu$ phosphor (100 parts by mass) was used instead of the SrS:Eu phosphor (100 parts by mass).

Example 1-6

$ZnCO_3$ and $B_2O_3$ were weighed, mixed using a mortar, and transferred to an alumina boat, and the mixture was calcined with an electric furnace set at 900° C. to obtain crystalline $ZnB_6O_{11}$.

Next, a phosphor (sample) attached with $ZnB_6O_{11}$ particles to the outermost surface thereof was obtained in the same manner as in Example 1, except that $ZnB_6O_{11}$ was used instead of $BaB_4O_7$.

Comparative Example 2: Synthesis of $SrGa_2S_4$:$Eu^{2+}$ ($Sr_{2.91}Eu_{0.09}Ga_2S_4$) Phosphor SrS, $Ga_2S_3$, and EuS as a starting material were weighed and mixed so as to yield the target composition, and mixed for 100 minutes with a paint shaker using φ 3 mm zirconia balls as media. The obtained mixture was calcined in a hydrogen sulfide atmosphere at 1100° C. for 6 hours. Next, the calcined product was crushed for 1 minute with a mortar and pestle machine ("ALM-360T" manufactured by NITTO KAGAKU Co., Ltd.), and using sieves with 140 mesh and 440 mesh openings, the material under the sieve with 140 mesh opening and above the sieve with 440 mesh opening was recovered to obtain phosphor powder (sample) formed from $SrGa_2S_4:Eu^{2+}$.

Comparative Example 2-1: Coating With $ZnO$—$B_2O_3$-Based Glass

A $ZnO$—$B_2O_3$-based glass-coated $SrGa_2S_4$:Eu phosphor (referred to as "glass-coated phosphor of Comparative Example 2-1," sample) was obtained by the same method as in Comparative Example 1-1, except that the $SrGa_2S_4$:Eu phosphor obtained in Comparative Example 2 was used instead of the CaS:Eu phosphor used in Comparative Example 1-1.

Comparative Example 2-2: Coating With $SiO_2$—$B_2O_3$-Based Glass

The $SrGa_2S_4$:Eu phosphor obtained in Comparative Example 2 was added to ethanol and suspended, deionized water, $Si(OEt)_4$, and $H_3BO_3$ were added thereto such that glass powder became 10 parts by mass, a small amount of ammonia water was further added as a catalyst, and hydrolysis at 60° C. was carried out to synthesize a glass precursor/phosphor complex in which a precursor gel of glass was coated on the phosphor surface. This glass precursor/phosphor complex was subjected to heat treatment at 600° C. for 30 minutes, thereby obtaining $B_2O_3$—$SiO_2$-based glass-coated $SrGa_2S_4$:Eu phosphor powder (referred to as "glass-coated phosphor of Comparative Example 2-2," sample).

Comparative Example 2-3: Coating With ZnO Compound

A ZnO-coated $SrGa_2S_4$:Eu phosphor powder (sample) was obtained by the same method as in Comparative Example 1-3, except that the $SrGa_2S_4$:Eu phosphor obtained in Comparative Example 2 was used instead of the CaS:Eu phosphor used in Comparative Example 1-3.

Example 2: Coating With $BaB_4O_7$

A $SrGa_2S_4$:Eu phosphor (sample) attached with $BaB_4O_7$ particles to the surface thereof was obtained by the same method as in Example 1, except that the $SrGa_2S_4$:Eu phosphor obtained in Comparative Example 2 was used instead of the CaS:Eu phosphor used in Example 1.

Example 2-1-1: Coating With $BaB_4O_7$

A $ZnO$—$B_2O_3$ glass-coated $SrGa_2S_4$:Eu phosphor (sample) attached with $BaB_4O_7$ particles to the outermost surface thereof was obtained by the same method as in Example 1-1-1, except that the glass-coated phosphor of Comparative Example 2-1 was used instead of the glass-coated phosphor of Comparative Example 1-1 used in Example 1-1-1.

Example 2-1-2: Coating With $BaB_2O_4$

A $ZnO$—$B_2O_3$ glass-coated $SrGa_2S_4$:Eu phosphor (sample) attached with $BaB_2O_4$ particles to the outermost surface thereof was obtained by the same method as in Example 1-1-2, except that the glass-coated phosphor of Comparative Example 2-1 was used instead of the glass-coated phosphor of Comparative Example 1-1 used in Example 1-1-2.

Example 2-1-3: Coating With $Ba_2B_2O_5$

A $ZnO$—$B_2O_3$ glass-coated $SrGa_2S_4$:Eu phosphor (sample) attached with $Ba_2B_2O_5$ particles to the outermost surface thereof was obtained by the same method as in Example 1-1-3, except that the glass-coated phosphor of Comparative Example 2-1 was used instead of the glass-coated phosphor of Comparative Example 1-1 used in Example 1-1-3.

Example 2-1-4: Coating With $Ba_3B_2O_6$

A $ZnO$—$B_2O_3$ glass-coated $SrGa_2S_4$:Eu phosphor (sample) attached with $Ba_3B_2O_6$ particles to the outermost surface thereof was obtained by the same method as in Example 1-1-4, except that the glass-coated phosphor of Comparative Example 2-1 was used instead of the glass-coated phosphor of Comparative Example 1-1 used in Example 1-1-4.

Example 2-2: Coating With $BaB_4O_7$

Into an eggplant-shaped flask, 10 parts by mass of crystalline ZnO particles (average particle diameter of 30 nm) with respect to the glass-coated phosphor of Comparative Example 2-2 (100 parts by mass) was introduced along with 50 mL of ethanol, and ZnO was dispersed in ethanol with an ultrasonic cleaning device. Thereto, powder of the glass-coated phosphor of Comparative Example 2-2 was added and ethanol was evaporated while stirring with a rotary evaporator to obtain a $B_2O_3$—$SiO_2$-based glass/ZnO-coated $SrGa_2S_4$:Eu phosphor. This phosphor was used instead of the phosphor of Comparative Example 1 used in Example 1 and the same method as in Example 1 was performed to obtain a $B_2O_3$—$SiO_2$-based glass/ZnO-coated $SrGa_2S_4$:Eu phosphor (sample) attached with $BaB_4O_7$ particles to the outermost surface thereof.

Example 2-3: Coating With $BaB_4O_7$

The glass-coated phosphor of Comparative Example 2-1 (100 parts by mass) was added to ethanol, suspended, and then added to an evaporator such that $SiO_2$ glass powder became 5 parts by mass. The resultant mixture was evaporated by dryness to obtain a $ZnO$—$B_2O_3$—$SiO_2$-based glass-coated $SrGa_2S_4$:Eu phosphor. Further, the $ZnO$—$B_2O_3$—$SiO_2$-based glass-coated $SrGa_2S_4$:Eu phosphor (100 parts by mass) was put into the evaporator and the slurry was further added such that $BaB_4O_7$ became 5 parts by mass. The resultant mixture was evaporated by dryness to obtain a $ZnO$—$B_2O_3$—$SiO_2$-based glass-coated $SrGa_2S_4$:Eu phosphor (sample) attached with $BaB_4O_7$ particles to the outermost surface thereof.

Examples 2-4 and 2-5: Coating With Various Kinds of Crystalline Metal Borate In Example 2-4, $CaCO_3$ and $B_2O_3$ were weighed, mixed using a mortar well, and transferred to an alumina boat, and the mixture was calcined with an electric furnace set at 900° C. to obtain crystalline $CaB_2O_4$.

In Example 2-5, $SrCO_3$ and $B_2O_3$ were weighed, mixed using a mortar well, and transferred to an alumina boat, and the mixture was calcined with an electric furnace set at 900° C. to obtain crystalline $Sr_2B_2O_5$.

Next, a $ZnO$—$B_2O_3$—$SiO_2$-based glass-coated $SrGa_2S_4$:Eu phosphor (sample) attached with the crystalline metal borate particles to the outermost surface thereof was obtained in the same manner as in Example 2-3, except that the crystalline metal borate was used instead of $BaB_4O_7$.

Example 2-6

Phosphor powder (sample) formed from $CaGa_2S_4$:$Eu^{2+}$ was obtained in the same manner as in Comparative Example 2, except that CaS was used as a starting material instead of SrS.

Next, a $ZnO$—$B_2O_3$—$SiO_2$-based glass-coated $CaGa_2S_4$:Eu phosphor (sample) attached with $BaB_4O_7$ particles to the outermost surface thereof was obtained in the same manner as in Example 2-3, except that the $CaGa_2S_4$:Eu phosphor was used instead of the $SrGa_2S_4$:Eu phosphor.

Example 2-7

Phosphor powder (sample) formed from $Ba_{0.2}Sr_{0.8}Ga_2S_4$:$Eu^{2+}$ was obtained in the same manner as in Comparative Example 2, except that BaS, SrS, $Ga_2S_3$, and EuS as a starting material were weighed and mixed so as to yield the target composition.

Next, a $ZnO$—$B_2O_3$—$SiO_2$-based glass-coated $Ba_{0.2}Sr_{0.8}Ga_2S_4$:Eu phosphor (sample) attached with $BaB_4O_7$ particles to the outermost surface thereof was obtained in the same manner as in Example 2-3, except that the $Ba_{0.2}Sr_{0.8}Ga_2S_4$:Eu phosphor was used instead of the $SrGa_2S_4$:Eu phosphor.

<Measurement of Ag Reflectance at Initial Stage>

An Ag film specimen in which an Ag film having a thickness of about 300 nm was formed on a glass substrate by a sputtering method was prepared, a paste obtained by dispersing each of the phosphors (samples) obtained in Examples and Comparative Examples in a silicone resin (TSJ3150 manufactured by Momentive Performance Materials Inc.) at a concentration of 30 wt % (hereinafter, referred to as "phosphor resin") was applied on the Ag film of the Ag film specimen, and the paste was thermally cured for 1 hour at 140° C.

This coated and cured sample was aged for 100 hours in an environment testing machine in a high-temperature and high-humidity atmosphere at 85° C. and 85% RH. After 100 hours, the sample was taken out, the phosphor resin was peeled off from the Ag film, and the reflectance of the Ag film surface was measured.

For the measurement of the reflectance, a fluorescence spectrophotometer (FP-6500 manufactured by JASCO Corporation) was used. Regarding the reflectance, the reflectance of $BaSO_4$ standard white plate was designated as 100% as a criterion.

The reflectance of the Ag film before the phosphor resin was applied was approximately 98%. In this regard, the reflectance of the Ag film after aging for 100 hours was measured, and the value was designated as a reflectance maintenance factor (%) after 100 hours.

<Evaluation of Moisture Resistance (PCT Test)>

Each of the phosphors (samples) obtained in Examples and Comparative Examples was mixed with a silicone resin (OE-6630 manufactured by Dow Corning Toray Co., Ltd.) at a proportion of 40 wt %, the mixture was applied on a glass plate so as to have a thickness of about 300 μm, and the mixture was thermally cured for 1 hour at 140° C. Subsequently, the luminescent efficiency before and after a HAST test was measured for the evaluation of moisture resistance of the phosphor.

The HAST test was carried out according to IEC68-2-66 so as to store the phosphor (sample) in a saturated PCT vessel (120° C., 100% RH) for 72 hours.

Regarding the luminescence efficiency, the external quantum efficiency (excitation wavelength of 450 nm) was measured with a fluorescence spectrophotometer (FP-6500 manufactured by JASCO Corporation), and the maintenance factor (%) obtained when the external quantum efficiency before the HAST test was designated as 100%, was indicated as an evaluation value for moisture resistance.

Further, based on the maintenance factor (%), determination on the moisture resistance was performed according to the following criteria.
A: 90% or more (Excellent)
B: 70% or more but less than 90% (Acceptable level)
C: less than 70% (Poor)

<Ag Corrosion Test>

A phosphor (sample) was mixed with a silicone resin (OE-6630 manufactured by Dow Corning Toray Co., Ltd.) at a proportion of 8 wt %, the mixture was potted into an LED package (6 mm square) that used an Ag electrode, and was thermally cured for 1 hour at 140° C. Subsequently, the LED was lit at a current of 60 mA, and the "initial luminous flux (unit: Lm)" was measured.

The LED package with which measurement of the initial luminous flux was completed was aged for 1,000 hours in an environment testing machine in a high-temperature and high-humidity atmosphere at 85° C. and 85% RH, and the luminous flux was measured by the same method. This was expressed as a lumen maintenance factor (%) in the case of designating the initial luminous flux as 100%.

Further, based on the lumen maintenance factor (%), determination on the Ag corrosion property was performed according to the following criteria.
A: 90% or more (Excellent)
B: 70% or more but less than 90% (Acceptable level)
C: less than 70% (Poor)

<Overall Determination>

Based on the results of the two evaluation tests, overall determination was performed according to the following criteria.
AA: a case in which both the moisture resistance test and the Ag corrosion test were determined as A (Excellent)
A: a case in which one of the moisture resistance test and the Ag corrosion test was determined as A and the other was determined as B (Excellent)
B: a case in which both the moisture resistance test and the Ag corrosion test were determined as B (Acceptable)
C: a case in which either one or both of the moisture resistance test and the Ag corrosion test were determined as C (Poor)

TABLE 1

| | Sulfur-containing phosphor | Glass coating layer | ZnO compound | Crystalline metal borate | Evaluation of moisture resistance (PCT) | | Ag corrosion test | | Overall Determination |
|---|---|---|---|---|---|---|---|---|---|
| | | | | | Maintenance factor (%) | Determination | Maintenance factor (%) | Determination | |
| Comparative Example 1 | CaS:Eu | — | — | — | 0 | C | 15 | C | C |
| Comparative Example 1-1 | CaS:Eu | ZnO—$B_2O_3$ | — | — | 82 | B | 59 | C | C |
| Comparative Example 1-1-1 | CaS:Eu | ZnO—$B_2O_3$ | — | $Na_2B_4O_7$ | 0 | C | 25 | C | C |
| Comparative Example 1-2-1 | CaS:Eu | $SiO_2$ | — | — | 66 | C | 31 | C | C |

TABLE 1-continued

| | Sulfur-containing phosphor | Glass coating layer | ZnO compound | Crystalline metal borate | Evaluation of moisture resistance (PCT) | | Ag corrosion test | | |
|---|---|---|---|---|---|---|---|---|---|
| | | | | | Maintenance factor (%) | Determination | Maintenance factor (%) | Determination | Overall Determination |
| Comparative Example 1-2-2 | CaS:Eu | $SiO_2$ | ZnO | — | 74 | B | 69 | C | C |
| Comparative Example 1-3 | CaS:Eu | — | ZnO | — | 13 | C | 68 | C | C |
| Example 1 | CaS:Eu | — | — | $BaB_4O_7$ | 88 | B | 92 | A | A |
| Example 1-1-1 | CaS:Eu | ZnO—$B_2O_3$ | — | $BaB_2O_7$ | 95 | A | 97 | A | AA |
| Example 1-1-2 | CaS:Eu | ZnO—$B_2O_3$ | — | $BaB_2O_4$ | 97 | A | 95 | A | AA |
| Example 1-1-3 | CaS:Eu | ZnO—$B_2O_3$ | — | $Ba_2B_2O_5$ | 99 | A | 97 | A | AA |
| Example 1-1-4 | CaS:Eu | ZnO—$B_2O_3$ | — | $Ba_3B_2O_6$ | 92 | A | 95 | A | AA |
| Example 1-1-5 | CaS:Eu | ZnO—$B_2O_3$ | — | $Mg_2B_3O_{11}$ | 100 | A | 92 | A | AA |
| Example 1-1-6 | CaS:Eu | ZnO—$B_2O_3$ | — | $CaB_2O_4$ | 100 | A | 79 | B | A |
| Example 1-1-7 | CaS:Eu | ZnO—$B_2O_3$ | — | $Sr_2B_2O_5$ | 95 | A | 81 | B | A |
| Example 1-2 | CaS:Eu | $SiO_2$ | ZnO | $BaB_4O_7$ | 99 | A | 98 | A | AA |
| Example 1-3 | CaS:Eu | ZnO—$B_2O_3$—$SiO_2$ | — | $BaB_4O_7$ | 100 | A | 97 | A | AA |
| Example 1-4 | SrS:Eu | ZnO—$B_2O_3$—$SiO_2$ | — | $BaB_4O_7$ | 85 | B | 89 | B | B |
| Example 1-5 | $Ca_{0.2}Sr_{0.8}S$:Eu | ZnO—$B_2O_3$—$SiO_2$ | — | $BaB_4O_7$ | 89 | B | 92 | A | A |
| Example 1-6 | CaS:Eu | — | — | $ZnB_6O_{11}$ | 97 | A | 86 | B | A |

TABLE 2

| | Sulfur-containing phosphor | Glass coating layer | ZnO compound | Crystalline metal borate | Evaluation of moisture resistance (PCT) | | Ag corrosion test | | |
|---|---|---|---|---|---|---|---|---|---|
| | | | | | Maintenance factor (%) | Determination | Maintenance factor (%) | Determination | Overall Determination |
| Comparative Example 2 | $SrGa_2S_4$:Eu | — | — | — | 1 | C | 12 | C | C |
| Comparative Example 2-1 | $SrGa_2S_4$:Eu | ZnO—$B_2O_3$ | — | — | 79 | B | 45 | C | C |
| Comparative Example 2-2 | $SrGa_2S_4$:Eu | $SiO_2$—$B_2O_3$ | — | — | 91 | A | 18 | C | C |
| Comparative Example 2-3 | $SrGa_2S_4$:Eu | — | ZnO | — | 2 | C | 56 | C | C |

TABLE 2-continued

| | Sulfur-containing phosphor | Glass coating layer | ZnO compound | Crystalline metal borate | Evaluation of moisture resistance (PCT) | | Ag corrosion test | | Overall Determination |
|---|---|---|---|---|---|---|---|---|---|
| | | | | | Maintenance factor (%) | Determination | Maintenance factor (%) | Determination | |
| Example 2 | $SrGa_2S_4$:Eu | — | — | $BaB_4O_7$ | 91 | A | 90 | A | AA |
| Example 2-1-1 | $SrGa_2S_4$:Eu | ZnO—$B_2O_3$ | — | $BaB_4O_7$ | 94 | A | 98 | A | AA |
| Example 2-1-2 | $SrGa_2S_4$:Eu | ZnO—$B_2O_3$ | — | $BaB_2O_4$ | 98 | A | 97 | A | AA |
| Example 2-1-3 | $SrGa_2S_4$:Eu | ZnO—$B_2O_3$ | — | $Ba_2B_2O_5$ | 97 | A | 94 | A | AA |
| Example 2-1-4 | $SrGa_2S_4$:Eu | ZnO—$B_2O_3$ | — | $Ba_3B_2O_6$ | 95 | A | 95 | A | AA |
| Example 2-2 | $SrGa_2S_4$:Eu | $SiO_2$—$B_2O_3$ | ZnO | $BaB_4O_7$ | 99 | A | 96 | A | AA |
| Example 2-3 | $SrGa_2S_4$:Eu | ZnO—$B_2O_3$—$SiO_2$ | — | $BaB_4O_7$ | 100 | A | 96 | A | AA |
| Example 2-4 | $SrGa_2S_4$:Eu | ZnO—$B_2O_3$—$SiO_2$ | — | $CaB_2O_4$ | 100 | A | 96 | A | AA |
| Example 2-5 | $SrGa_2S_4$:Eu | ZnO—$B_2O_3$—$SiO_2$ | — | $Sr_2B_2O_5$ | 99 | A | 96 | A | AA |
| Example 2-6 | $CaGa_2S_4$:Eu | ZnO—$B_2O_3$—$SiO_2$ | — | $BaB_4O_7$ | 98 | A | 94 | A | AA |
| Example 2-7 | $Ba_{0.2}Sr_{0.8}Ga_2S_4$:Eu | ZnO—$B_2O_3$—$SiO_2$ | — | $BaB_4O_7$ | 100 | A | 97 | A | AA |

Figure 10:
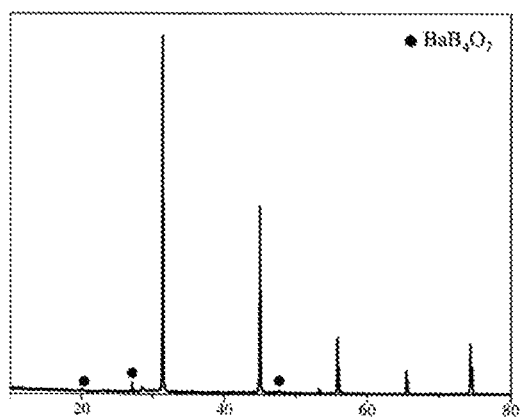
FIG. 10 is a diagram illustrating a powder X-ray diffraction chart of $BaB_4O_7$ obtained in Example 1-3.

Each crystalline metal borate obtained in Examples described above was measured according to the general principle of powder X-ray diffraction analysis (JIS K 0131-1996), and as a result of analysis of the obtained diffraction angle-diffraction intensity chart (also referred to as "powder X-ray diffraction chart"), in every case, the peak representing crystallinity was recognized. As an example, the diffraction angle-diffraction intensity chart of $BaB_4O_7$ obtained in Example 1-3 is illustrated in FIG. 10.

From the results of Examples described above and the results of tests which the inventors have been conducted, it was possible to obtain the effect that the sulfur-containing phosphor having a configuration in which a crystalline metal borate containing an IIA-Group element, boron, and oxygen is present on the surface of the sulfur-containing phosphor is excellent in moisture resistance. Furthermore, it was possible to obtain the effect that this phosphor inhibits the corrosion of the metal reflective film and the lumen maintenance factor is hardly lowered even when it is packaged as an LED and exposed under high-temperature and high-humidity test environments for 1,000 hours.

Further, the sulfur-containing phosphor having a configuration in which particles containing a crystalline metal borate containing zinc, boron, and oxygen are present on the surface of the sulfur-containing phosphor also had the same moisture resistance and the effect of lumen maintenance under high-temperature and high-humidity test environments.

The invention claimed is:

1. A phosphor comprising a configuration in which particles containing a metal borate having crystallinity, also referred to as "crystalline metal borate", that contains an IIA-Group element, boron, and oxygen, are on the surface of a sulfur-containing phosphor containing sulfur in a host material,
   wherein a diffraction peak derived from the crystalline metal borate in a diffraction angle-diffraction intensity chart according to a general principle of powder X-ray diffraction analysis JIS K 0131-1996 is recognized in the crystalline metal borate, and
   wherein the crystalline metal borate is contained in an amount of 0.005 parts by mass or more and 1 part by mass or less with respect to 1 part by mass of the sulfur containing phosphor,
   wherein the crystalline metal borate is a compound represented by BaxByOz, wherein x is 1 to 3, y is 2 to 4, and z is 4 to 7.

2. A phosphor comprising a layer containing the crystalline metal borate according to claim 1 on the surface of a sulfur-containing phosphor containing sulfur in a host material.

3. The phosphor according to claim 1, further comprising a glass coating layer containing a glass composition, on the surface of the sulfur-containing phosphor containing sulfur in a host material.

4. The phosphor according to claim 1, further comprising particles or a layer containing a ZnO compound, on the surface of the sulfur-containing phosphor containing sulfur in a host material.

5. A light-emitting device comprising:
   a solid luminescent device;
   a metallic member reacting with a sulfur-based gas; and
   a phosphor-containing layer, wherein the phosphor-containing layer is configured to contain the phosphor according to claim 1 in a resin.

6. A light-emitting device comprising:
a solid luminescent device;
a metallic member reacting with a sulfur-based gas; and
a phosphor-containing layer, wherein
the phosphor-containing layer has a configuration in which the phosphor according to claim 1 and a ZnO compound are scattered in a resin.

7. A phosphor molded body comprising a configuration in which a luminescent layer containing the phosphor according to claim 1 is disposed in a sealing layer formed from a transparent resin composition or a glass composition.

8. A solar power generation apparatus comprising:
the phosphor according to claim 1 receiving at least light including light in an ultraviolet range or light in a near-ultraviolet range of sunlight and emitting light in a visible light range; and
a solar cell receiving the light in a visible light range emitted by the phosphor and converting the light in a visible light range into an electrical signal.

9. The phosphor according to claim 1, wherein the crystalline metal borate is in contact with the surface of the sulfur-containing phosphor containing sulfur in a host material.

10. The phosphor according to claim 1, wherein a glass coating layer containing a glass composition is present on the surface of the sulfur-containing phosphor containing sulfur in a host material, and the crystalline metal borate is present on the surface of the glass coating layer.

11. The phosphor according to claim 1, wherein particles or a layer containing a ZnO compound is present on the surface of the sulfur-containing phosphor containing sulfur in a host material, and the crystalline metal borate is present on an outside of the particles or the layer containing the ZnO compound.

12. The phosphor according to claim 9, wherein a layer containing the crystalline metal borate is present on the surface of the sulfur-containing phosphor containing sulfur in a host material.

13. The phosphor according to claim 1, wherein the particles containing the crystalline metal borate have an average particle diameter of 1 nm or more and 10 μm or less as observed by SEM.

14. The phosphor according to claim 1, wherein a layer containing the crystalline metal borate is directly on the surface of the sulfur-containing phosphor containing sulfur in the host material.

* * * * *